(12) United States Patent
Jia et al.

(10) Patent No.: US 11,251,206 B2
(45) Date of Patent: Feb. 15, 2022

(54) DISPLAY SUBSTRATE AND METHOD FOR PREPARING THE SAME, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yihe Jia, Beijing (CN); Xiangqian Ding, Beijing (CN); Xiaoxiang Zhang, Beijing (CN); Mingxuan Liu, Beijing (CN); Hao Han, Beijing (CN); Lianjie Yang, Beijing (CN); Yongzhi Song, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 16/771,201

(22) PCT Filed: Aug. 20, 2019

(86) PCT No.: PCT/CN2019/101571
§ 371 (c)(1),
(2) Date: Jun. 9, 2020

(87) PCT Pub. No.: WO2021/031118
PCT Pub. Date: Feb. 25, 2021

(65) Prior Publication Data
US 2021/0057448 A1    Feb. 25, 2021

(51) Int. Cl.
*H01L 27/12*    (2006.01)
*H01L 51/00*    (2006.01)
(Continued)

(52) U.S. Cl.
CPC ........ *H01L 27/124* (2013.01); *H01L 27/1262* (2013.01); *H01L 21/0276* (2013.01);
(Continued)

(58) Field of Classification Search
CPC .............. H01L 27/124; H01L 27/1262; H01L 21/0276; H01L 21/31111; H01L 21/32134; H01L 51/0023; H01L 51/5281; H05K 3/06
See application file for complete search history.

(56) References Cited

U.S. PATENT DOCUMENTS 8,723,768 B2 * 5/2014 Egi .................. G02B 1/118
345/84
10,873,045 B2 * 12/2020 Dutta .................. H01L 51/447
(Continued)

FOREIGN PATENT DOCUMENTS

CN    100474559 C    4/2009
CN    103231570 A    8/2013
(Continued)

*Primary Examiner* — Mohsen Ahmadi
(74) *Attorney, Agent, or Firm* — McCoy Russell LLP

(57) ABSTRACT

The present disclosure provides a display substrate, a method for preparing the same, and a display device. The display substrate includes: a base substrate; a metal pattern located on the base substrate, and an anti-reflection pattern located on a surface of the metal pattern proximate to the base substrate, in which a difference between a first slope angle of the anti-reflection pattern and a second slope angle of the metal pattern is less than a first threshold, and a distance between a first edge of a side surface of the anti-reflection pattern proximate to the metal pattern and a second edge of a side surface of the metal pattern proximate to the anti-reflection pattern is less than a second threshold.

17 Claims, 4 Drawing Sheets

(51) Int. Cl.
    *H01L 51/52*       (2006.01)
    *H01L 21/3213*    (2006.01)
    *H01L 21/311*     (2006.01)
    *H01L 21/027*     (2006.01)
    *H05K 3/06*       (2006.01)

(52) U.S. Cl.
    CPC ... *H01L 21/31111* (2013.01); *H01L 21/32134* (2013.01); *H01L 51/0023* (2013.01); *H01L 51/5281* (2013.01); *H05K 3/06* (2013.01)

(56) References Cited

U.S. PATENT DOCUMENTS

| | | |
|---|---|---|
| 2005/0245087 A1 | 11/2005 | Sasagawa et al. |
| 2015/0171209 A1 | 6/2015 | Jiang et al. |
| 2018/0355467 A1 | 12/2018 | Lee et al. |
| 2019/0148419 A1 | 5/2019 | Song et al. |

FOREIGN PATENT DOCUMENTS

| | | |
|---|---|---|
| CN | 107393933 A | 11/2017 |
| CN | 108292179 A | 7/2018 |

* cited by examiner

DISPLAY SUBSTRATE AND METHOD FOR PREPARING THE SAME, AND DISPLAY DEVICE

CROSS-REFERENCE TO RELATED APPLICATION

This application is the U.S. national phase of PCT Application No. PCT/CN2019/101571 filed on Aug. 20, 2019. The entire contents of the above-listed application are hereby incorporated by reference for all purposes.

TECHNICAL FIELD

The present disclosure relates to the field of display technology, in particular to a display substrate, a method for preparing the same, and a display device.

BACKGROUND AND SUMMARY

In the related art of display substrate, the metal pattern proximate to a light emitting side of the display substrate will reflect the ambient light.

The embodiment of the present disclosure provides a display substrate, a method for preparing the same, and a display device.

Embodiments of the present disclosure provide technical solutions as follows:

In one aspect, a display substrate is provided, including: a base substrate; a metal pattern located on the base substrate; and an anti-reflection pattern located on a surface of the metal pattern proximate to the base substrate, in which a difference between a first slope angle of the anti-reflection pattern and a second slope angle of the metal pattern is less than a first threshold, and a distance between a first edge of a side surface of the anti-reflection pattern proximate to the metal pattern and a second edge of a side surface of the metal pattern proximate to the anti-reduction pattern is less than a second threshold, and in which the first slope angle is an acute angle formed between a side surface of the anti-reflection pattern and the base substrate, the second slope angle is an acute angle formed between a side surface of the metal pattern and the base substrate, and the first edge and the second edge are located on a same side of the anti-reflection pattern.

Optionally, the first threshold is 5°, and the second threshold is 10 nm.

Optionally, the first slope angle is equal to the second slope angle, and the first edge coincides with the second edge.

Optionally, the first slope angle is in a range of 55° to 65°, and the second slope angle is in a range of 55° to 65°.

Optionally, the metal pattern includes a signal line, a second slope angle of the signal line being (A−5°) to (A+5°), and a line width of the signal line being (D−1) μm to (D+1) μm, in which A is a preset reference value of the second slope angle, and D is a preset reference value of the width of the signal line, and in which a line width of the metal pattern is a width of an orthogonal projection of the metal pattern on the base substrate in a third direction, and the third direction is perpendicular to the extending direction of the metal pattern.

Optionally, a thickness of the anti-reflection pattern satisfies:

$$2*n*h=(2k-1)*(\lambda/2),$$

in which n is a refractive index of the anti-reflection pattern, h is the thickness of the anti-reflection pattern, k is a positive integer, and λ is a wavelength of incident light.

Optionally, n is in a range of 2.2 to 2.3.

Optionally, the thickness of the anti-reflection pattern is in a range of 50 nm to 60 nm.

Optionally, the metal pattern is a gate metal layer pattern of the display substrate.

Optionally, a material of the metal pattern is copper, and a material of the anti-reflection pattern is molybdenum oxide doped with a corrosion-resistant metal.

Optionally, the corrosion-resistant metal is selected from precious metals, VB group elements, and platinum group elements.

Optionally, the corrosion-resistant metal includes at least one of:

ruthenium, rhodium, palladium, silver, osmium, iridium, platinum, gold, and tantalum.

Optionally, in the anti-reflection pattern, the molar ratio of the corrosion-resistant metal to molybdenum is (4:100) to (6:100).

An embodiment of the present disclosure also provides a display device, which includes the display substrate as described above and a color filter substrate oppositely arranged to form a cell with the display substrate, and the display substrate is located on a light exiting side of the color filter substrate.

An embodiment of the present disclosure also provides a method for preparing a display substrate, which includes: providing a base substrate; forming an anti-reflection layer and a metal layer in sequence on the base substrate; coating photoresist on the metal layer, and exposing and developing of the photoresist to form a photoresist pattern; forming an anti-reflection layer pattern and a metal pattern respectively by simultaneously etching the anti-reflection layer and the metal layer with an etching solution using the photoresist pattern as a mask, in which a difference between a first slope angle of the anti-reflection pattern and a second slope angle of the metal pattern is less than a first threshold, and a distance between a first edge of a side surface of the anti-reflection pattern proximate to the metal pattern and a second edge of a side surface of the metal pattern proximate to the anti-reflection pattern is less than a second threshold, and in which the first slope angle is an acute angle formed between a side surface of the anti-reflection pattern and the base substrate, the second slope angle is an acute angle formed between a side surface of the metal pattern and the base substrate, and the first edge and the second edge are located on a same side of the anti-reflection pattern.

Optionally, a difference between a etching rate of the anti-reflection layer and an etching rate of the metal layer in a same etching conditions is less than a rate threshold.

Optionally, the rate threshold is 0.5 nm/s.

Optionally, the forming the anti-reflection layer and the metal layer in sequence on the base substrate includes: bombarding a target made of molybdenum oxide doped with a corrosion-resistant metal by using a first plasma, to form the anti-reflection layer on the base substrate; and bombarding a target made of copper by using a second plasma, to form the metal layer on the base substrate.

Optionally, in the target material made of molybdenum oxide doped with the corrosion-resistant metal, a molar ratio of the corrosion-resistant metal to molybdenum is (4:100) to (6:100).

Optionally, a film-forming rate of the anti-reflection layer is in a range of 1.3 nm/s to 1.4 nm/s.

Optionally, the etching solution is a mixed solution of $H_2SO_4$ and $H_2O_2$, and a volume ratio of $H_2O_2$ in the mixed solution is in a range of 3% to 5%.

Optionally, the etching solution includes a metal ion, and the metal ion and the metal layer are made of a same metal element.

Optionally, when the metal layer is made of copper, a concentration of copper ions in the etching solution is in a range of 200 ppm to 1500 ppm.

REFERENCE NUMBERS 1 base substrate; 2 anti-reflection layer; 3 metal layer; 4 first light; 5 second light; 6 anti-reflection pattern; 7 metal pattern; 8 photoresist pattern; 9 conductive pattern.

DETAILED DESCRIPTION

In order to make the technical problems to be solved, the technical solutions, and the advantages of the examples of the present disclosure, the present disclosure will be described hereinafter in conjunction with the drawings and specific examples.

Figure 1:
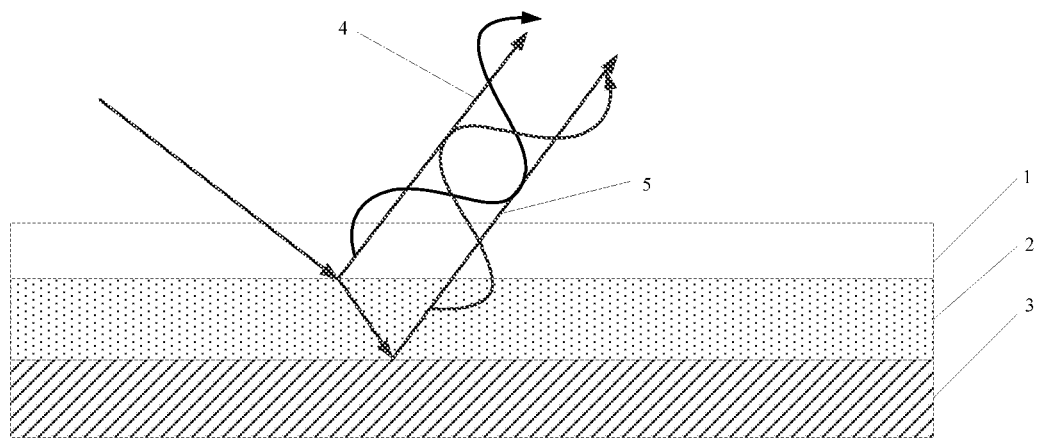
FIG. 1 is a schematic view showing the forming an anti-reflection layer on a metal layer.

As shown in FIG. 1, the metal layer 3, such as the gate metal layer, is located on the light emitting side of the display substrate, and ambient light is incident on the metal layer 3 and reflected by the metal layer 3 after being incident through the base substrate 1, so that the substrate will still emit light in a black state. In order to reduce the reflection of the display substrate to the ambient light, the anti-reflection layer 2 can be added on the light emitting side of the metal layer 3, so that after the ambient light is incident on the surfaces of the metal layer 3, the second light 5 and the first light 4 reflected by the two surfaces will interfere with and offset each other, thereby achieving an anti-reflection effect.

Figure 2A:
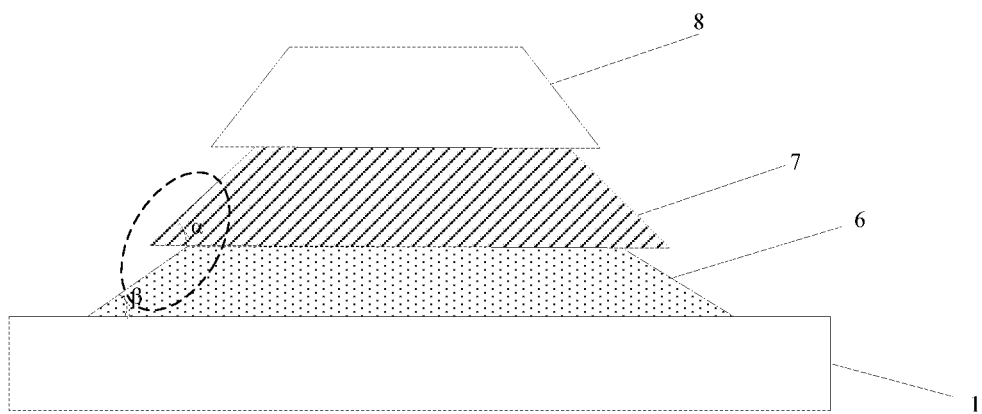
FIGS. 2A and 2B are schematic views showing the cross sections of the metal pattern and the anti-reflection pattern.
Figure 2B:
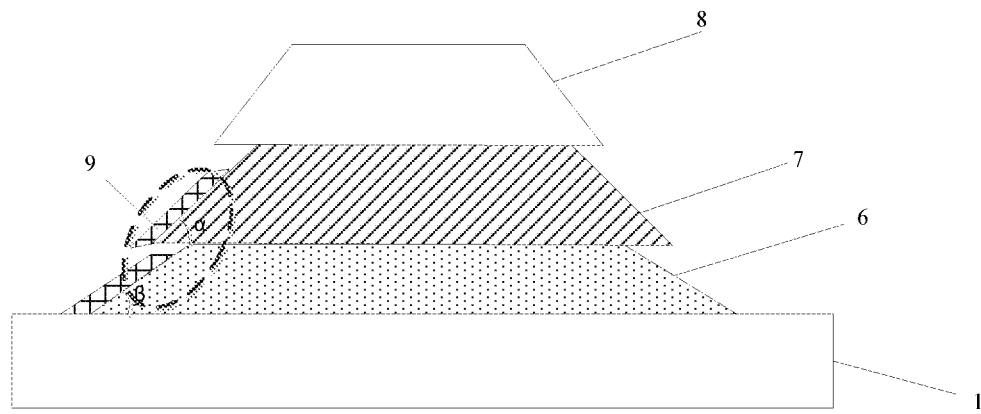

An embodiment of the present disclosure provides a display substrate, as shown in FIGS. 2A and 2B, including a base substrate 1, a metal pattern 7 on the base substrate 1, and an anti-reflection pattern 6 on a surface of the metal pattern 7 proximate to the base substrate 1, so that the reflection of the ambient light by the display substrate can be reduced through the anti-reflection pattern 6.

The anti-reflection layer 2 is mostly made of molybdenum oxide $MoO_x$, and the metal layer 3 is mostly made of copper. The etching rate of molybdenum oxide in the acidic etching solution is greater than that of copper in the acidic etching solution. In this way, in the process of manufacturing the display substrate, when the metal layer 3 and the anti-reflection layer 2 are etched by an acidic etching solution using a photoresist 8 as a mask, as shown in FIG. 2A, the undercut phenomenon as shown in the dotted frame will occur. Since the anti-reflection layer 2 has a greater etching rate in the acidic etching solution, the slope angle β of the longitudinal section of the formed anti-reflection pattern 6 is less than the slope angle α of the longitudinal section of the formed metal pattern 7. The longitudinal section of the metal pattern 7 is the section of the metal pattern 7 in the first direction, the first direction is perpendicular to the base substrate 1 and perpendicular to the extending direction of the metal pattern 7, the longitudinal section of the anti-reflection pattern 6 being a cross section of the anti-reflection pattern 6 in the second direction, the second direction being perpendicular to the base substrate 1 and perpendicular to the extension direction of the anti-reflection pattern 6. The undercut phenomenon will affect the connection between the metal pattern 7 and other conductive patterns. For example, when other layers of the conductive patterns are connected to the metal pattern 7, as shown in FIG. 2B, the conductive pattern 9 in contact with the metal pattern 7 will break at the undercut A. In this way, in the case that three is disconnection at the undercut, it will result in a defective product of the display substrate.

Figure 3A:
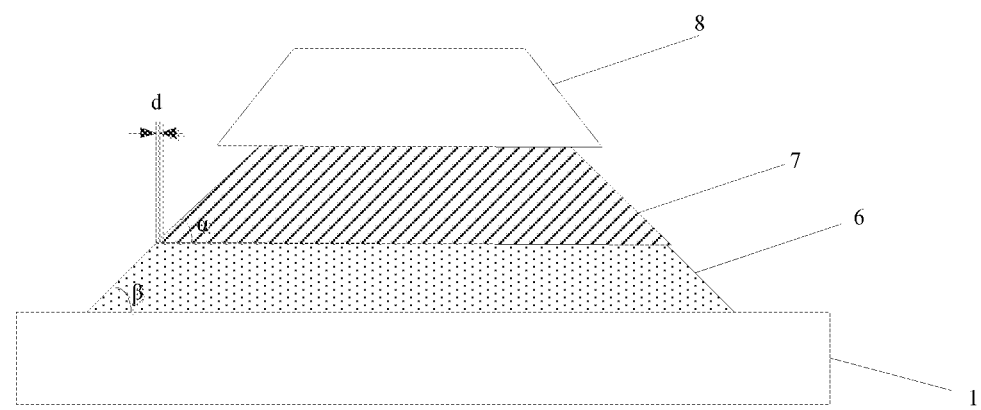
FIGS. 3A and 3B are schematic views showing the cross sections of the metal pattern and the anti-reflection pattern according to an embodiments of the present disclosure.
Figure 3B:
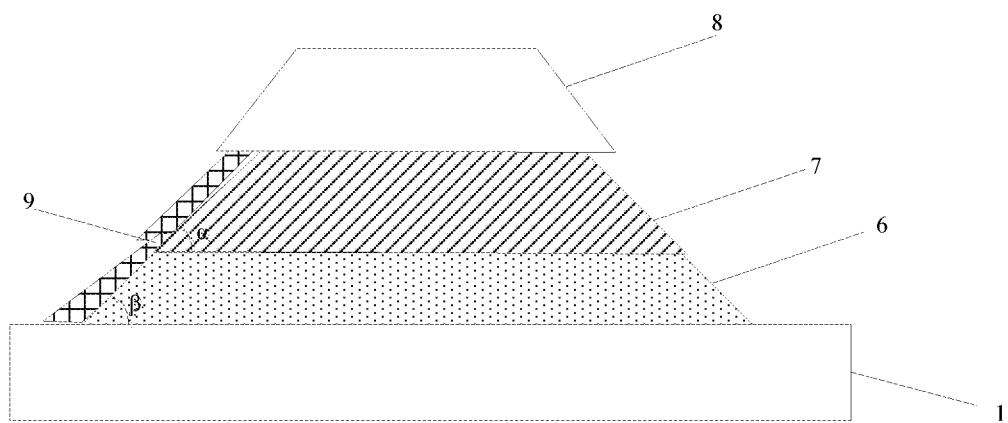

To avoid undercut phenomenon, an embodiments of the present disclosure provide a display substrate, as shown in FIGS. 3A and 3B, including a base substrate 1, a metal pattern 7 on the base substrate 1, and an anti-reflection pattern 6 located on a surface of the metal pattern 7 proximate to the base substrate 1, in which a difference between the first slope angle β of the anti-reflection pattern 6 and the second slope angle α of the metal pattern 7 is less than a first threshold, and a distance d between a first edge of a side surface of the anti-reflection pattern proximate to the metal pattern and a second edge of a side surface of the metal pattern proximate to the anti-reflection pattern is less than a second threshold, and in which the first slope angle β is an acute angle formed between the side surface of the anti-reflection pattern 6 and the base substrate 1, the second slope angle α is the acute angle formed between a side surface of the metal pattern 7 and the base substrate 1, and the first edge and the second edge are located on a same side of the anti-reflection pattern 6.

The anti-reflection pattern 6 is proximate to the metal pattern 7 and is located between the metal pattern 7 and the base substrate 1. When the metal pattern 7 is located on the light exiting side of the base substrate 1, as shown in FIGS. 3A and 3B, the anti-reflection pattern 6 may be adjacent to the base substrate 1, that is, in contact with the base substrate 1.

In this embodiment, a difference between the first slope angle β of the anti-reflection pattern 6 and the second slope angle α of the metal pattern 7 is less than the first threshold, and a distance between the first edge and the second edge is less than the second threshold, thereby avoiding the undercut phenomenon, optimizing the connection between the metal pattern 7 and other conductive patterns, and improving the product yield of the display substrate.

Specifically, the first threshold is 5°, the second threshold is 10 nm, the difference between the first slope angle β of the anti-reflection pattern 6 and the second slope angle α of the metal pattern 7 is less than 5°, the distance d between the first edge and the second edge is less than the second threshold. As shown in FIG. 3B, when other conductive patterns 9 are connected to the metal pattern 7, it will not break at the side surface of the metal pattern 7 and the anti-reflection pattern 6, thereby optimizing the connection between the metal pattern 7 and other conductive patterns 9 and improving the product yield of the display substrate.

In a specific embodiment, the first slope angle β is equal to the second slope angle α, and the first edge coincides with the second edge, that is, d=0, thereby eliminating the undercut phenomenon, so that the side surface of the anti-reflection pattern 6 and the side surface of the metal pattern 7 can be located on a same plane. In this way, when other conductive patterns are connected to the metal pattern 7, there is no disconnection, thereby optimizing the connection between the metal pattern 7 and other conductive patterns, and improving the product yield of the display substrate.

Among them, the first slope angle may be in a range of 55° to 65°, and the second slope angle may be in a range of 55° to 65°.

Among them, when the metal pattern 7 is a signal line, the second slope angle of the metal pattern 7 is (A−5°) to (A+5°), and a line width of the signal line is (D−1) μm to (D+1) μm, in which A is a preset reference value of the second slope angle, D is a preset reference value of the width of the signal line. A may be about 60°, and D may be in a range of 20 μm to 40 μm. The line width of the metal pattern 7 is a width of an orthogonal projection of the metal pattern 7 on the base substrate in a third direction, and the third direction is perpendicular to the extending direction of the metal pattern. The above embodiments can ensure the size uniformity of the metal pattern 7, and optimize the signal transmission performance of the display substrate. Among them, the signal line of the display substrate includes, but is not limited to, a gate line, a data line, and a common electrode line.

Specifically, the second slope angle and line width of the metal pattern 7 at different positions may be equal, that is, the sizes of the metal pattern 7 at different positions are the same.

Among them, the thickness of the anti-reflection pattern 6 is set such that the optical path difference of the reflected light on the upper and lower surfaces of the anti-reflection pattern 6 is an odd multiple of the half wavelength of the reflected light, and the thickness of the anti-reflection pattern 6 satisfies:

$$2*n*h=(2k-1)*(\lambda/2) \quad (1),$$

in which n is a refractive index of the anti-reflection pattern 6, n may be in a range of 2.2 to 2.3, h is the thickness of the anti-reflection pattern, k is a positive integer, and λ is a wavelength of incident light.

In this way, after the ambient light is incident on the surfaces of the metal pattern 7 and the anti-reflection pattern 6, the light reflected by the upper and lower surfaces of the anti-reflection pattern 6 will interfere with and offset each other, thereby achieving anti-reflection. Specifically, the thickness of the anti-reflection pattern 6 can be adjusted according to the wavelength of the incident light, as long as the optical path difference of the reflected light on the upper and lower surfaces of the anti-reflection pattern 6 is an odd multiple of the half wavelength of the reflected light. In addition, the wavelength is mostly around 550 nm, and most of the light is perpendicular to the anti-reflection pattern 6, so that λ in the above formula (1) can be 550 nm. When λ is equal to 550 nm and k=1, the display substrate can reduce to the reflectance of light with a wavelength of 450 nm to 600 nm 10% or less, thereby greatly reducing the reflection of the display substrate on the ambient light.

Optionally, the thickness of the anti-reflection pattern 6 may be in a range of 50 nm to 60 nm.

The metal pattern in this embodiment may be a metal pattern arranged on the light emitting side of the display substrate. In some display substrates, the gate metal layer pattern is arranged on the light emitting side of the display substrate. In order to reduce the reflection of the ambient light by the gate metal layer pattern, an anti-reflection pattern may be arranged between the gate metal layer pattern and the base substrate, the difference between the first slope angle of the anti-reflection pattern and the second slope angle of the gate metal layer pattern is less than the first threshold, and the distance between the first edge and the second edge of the metal pattern is less than the second threshold.

Since copper has good conductivity, the metal pattern 7 can be made of copper. Of course, the material of the metal pattern 7 is not limited to copper, and other metals having good conductivity can also be used. The anti-reflection pattern 6 may be made of molybdenum oxide. Of course, the material of the anti-reflection pattern 6 is not limited to molybdenum oxide, and other conductive materials having a certain light transmittance may also be used.

Since the etching rate of molybdenum oxide in the acidic etching solution is greater than that of copper in the acidic etching solution, in order to avoid the undercut phenomenon, the composition of the anti-reflection pattern 6 needs to be adjusted, and then the etching rate of anti-reflection pattern 6 in acidic etching solution is adjusted. In this embodiment, an corrosion-resistant metal is doped in the anti-reflection pattern 6, in which the corrosion-resistant metal is a metal having strong resistance to oxidation of oxygen and other corrosion, and will react with usual acid. Specifically, the corrosion-resistant metal may be selected from noble metals, VB group elements and platinum group elements, and may specifically be selected from at least one of: ruthenium, rhodium, palladium, silver, osmium, iridium, platinum, gold and tantalum. The etching rate of the anti-reflection pattern 6 in the acidic etching solution can be reduced by doping the anti-reflection pattern 6 with corrosion-resistant metal, and the etching rate of the anti-reflection pattern 6 in the acidic etching solution can be adjusted by adjusting the content of the corrosion-resistant metal in anti-reflection pattern 6, so that the etching rate of the anti-reflection pattern 6 in the acidic etching solution is close to or the same as the etching rate of the metal pattern 7 in the acidic etching solution, thereby reducing or avoiding the undercut phenomenon.

After the corrosion-resistant metal is doped into the anti-reflection pattern 6, the contact resistance between the anti-reflection pattern 6 and the metal pattern 7 can also be reduced. When the metal pattern 7 is a signal line, the signal transmission condition on the signal line can be optimized.

When the metal pattern 7 is a gate metal pattern, in this embodiment, since the distance between the first edge and the second edge is reduced, after the gate insulating layer is formed on the gate metal pattern, the parasitic capacitance between the metal pattern 7 and the data line of the display substrate can also be reduced, thereby preventing the electrical signal on the metal pattern 7 from affecting the data voltage on the data line, and further avoiding flickering of the picture and improving the display effect of the display device.

Specifically, in the anti-reflection pattern 6, the molar ratio of the corrosion-resistant metal to molybdenum is (4:100) to (6:100), so that the etching rate of the anti-reflection pattern 6 in the acidic etching solution is close to the etching rate of the metal pattern 7 in the acidic etching solution.

In this embodiment, the etching rate of the anti-reflection pattern in the acidic etching solution is adjusted by doping the anti-reflection pattern with a corrosion-resistant metal, so that the etching rate of the anti-reflection pattern in the acidic etching solution is close to the etching rate of the metal pattern in the acidic etching solution. In this way, after the anti-reflection pattern and the metal pattern is formed by etching, so that the undercut at the junction of the anti-reflection pattern and the metal pattern can be avoided, thereby improving the connection between other conductive patterns and the metal pattern, and improving the product yield of the display substrate.

An embodiment of the present disclosure further provides a display device, including the display substrate as described above and a color filter substrate oppositely arranged to form a cell with the display substrate, in which the display substrate is located on a light exiting side of the color filter substrate. The display device may be a liquid crystal display device or an organic light emitting diode display device. The display device may be any product or component having a display function, such as a television, a display, a digital photo frame, a mobile phone, a tablet computer, etc., in which the display device further includes a flexible circuit board, a printed circuit board, and a backplane.

Figure 4:
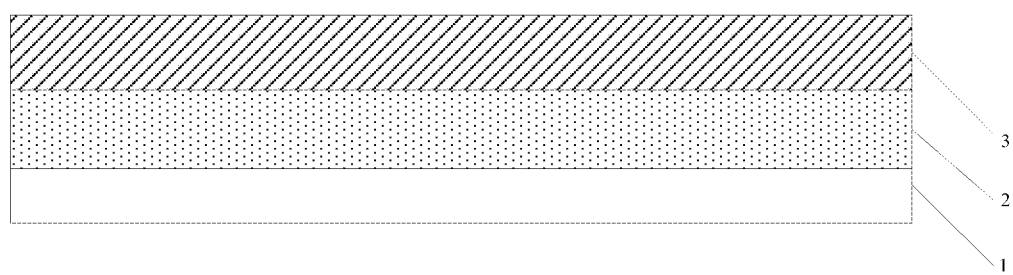
FIG. 4 is a schematic view showing the forming the metal layer and the anti-reflection layer according to an embodiment of the present disclosure.
Figure 5:
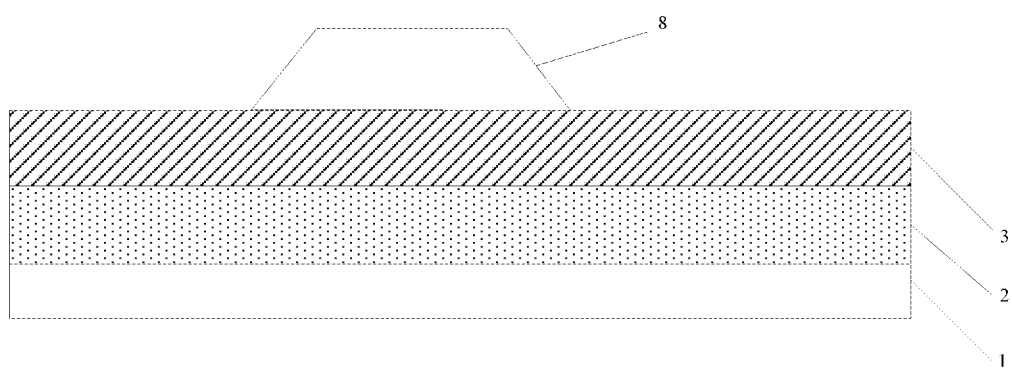
FIG. 5 is a schematic view showing the forming a photoresist pattern according to an embodiment of the present disclosure.

An embodiment of the present disclosure further provides a method for preparing a display substrate, including: as shown in FIG. 4, providing a base substrate 1; forming an anti-reflection layer 2 and a metal layer 3 in sequence on the base substrate 1; coating photoresist on the metal layer 3, as shown in FIG. 5, and exposing and developing of the photoresist to form a photoresist pattern 8; as shown in FIG. 3A, forming an anti-reflection layer pattern 6 and a metal pattern 7 respectively by simultaneously etching the anti-reflection layer 2 and the metal layer 3 with an etching solution using the photoresist pattern 8 as a mask, since the difference between the etch rate of the anti-reflection layer 2 and the etch rate of the metal layer 3 under the same etching condition is less than the rate threshold, a difference between a first slope angle β of the formed anti-reflection pattern 6 and a second slope angle α of the formed metal pattern 7 is less than a first threshold, and a distance d between a first edge of a side surface of the anti-reflection pattern 6 proximate to the metal pattern 7 and a second edge of a side surface of the metal pattern 6 proximate to the anti-reflection pattern 7 is less than a second threshold, the first slope angle is an acute angle formed between a side surface of the anti-reflection pattern 6 and the base substrate 1, the second slope angle is an acute angle formed between a side surface of the metal pattern 7 and the base substrate 1, and the first edge and the second edge are located on a same side of the anti-reflection pattern 6.

The rate threshold can be specifically 0.5 nm/s. Of course, the value of the rate threshold is not limited to 0.5 nm/s, and can also be other values, but the value of the rate threshold needs to ensure that the difference between the first slope angle β of the resulting anti-reflection pattern 6 and the second slope angle α of the metal pattern 7 is less than the first threshold and d is less than the second threshold.

In this embodiment, a difference between the first slope angle β of the anti-reflection pattern 6 and the second slope angle α of the metal pattern 7 is less than the first threshold, and d is less than the second threshold, thereby avoiding the undercut phenomenon, optimizing the connection between the metal pattern 7 and other conductive patterns, and improving the product yield of the display substrate. In order to ensure that the difference between the first slope angle β of the anti-reflection pattern 6 and the second slope angle α of the metal pattern 7 is less than the first threshold and d is less than the second threshold, the composition of the anti-reflection layer 2 needs to be adjusted, and the etching rate of the anti-reflection layer 2 in the etching solution is further adjusted, so that the etching rate of the anti-reflection layer 2 in the etching solution is close to or the same as the etching rate of the metal layer 3 in the etching solution.

Specifically, the first threshold is 5°, the second threshold is 10 nm, the difference between the first slope angle β of the anti-reflection pattern 6 and the second slope angle α of the metal pattern 7 is less than 5°, the distance d between the first edge and the second edge is less than the second threshold. When other conductive patterns are connected to the metal pattern, it may optimize the connection between the metal pattern 7 and other conductive patterns and improve the product yield of the display substrate.

The etching rate of the anti-reflection layer 2 may be equal to the etching rate of the metal layer 3 under the same etching condition, so that the first slope angle β is equal to the second slope angle α, and the first edge coincides with the second edge, that is, d=0, thereby eliminating the undercut phenomenon, and so that the side surface of the anti-reflection pattern 6 and the side surface of the metal pattern 7 can be located on a same plane. In this way, when other conductive patterns are connected to the metal pattern 7, there is no disconnection, thereby optimizing the connection between the metal pattern 7 and other conductive patterns, and improving the product yield of the display substrate.

The thickness of the anti-reflection pattern 6, that is, the thickness of the anti-reflection layer 2 is set such that the optical path difference of the reflected light on the upper and lower surfaces of the anti-reflection pattern 6 is an odd multiple of the half wavelength of the reflected light and the thickness of 6 satisfies:

$$2*n*h=(2k-1)*(\lambda/2) \quad (1);$$

in which n is a refractive index of the anti-reflection pattern 6, n may be 2.2 to 2.3, h is the thickness of the anti-reflection pattern, k is a positive integer, and λ is a wavelength of incident light.

In this way, after the ambient light is incident on the surfaces of the metal pattern 7 and the anti-reflection pattern 6, the light reflected by the upper and lower surfaces of the anti-reflection pattern 6 will interfere with and offset each other, thereby achieving anti-reflection. Specifically, the thickness of the anti-reflection pattern 6 can be adjusted according to the wavelength of the incident light, as long as the optical path difference of the reflected light on the upper and lower surfaces of the anti-reflection pattern 6 is an odd multiple of the half wavelength of the reflected light. In addition, the wavelength is mostly around 550 nm, and most of the light is perpendicular to the anti-reflection pattern 6, so that λ in the above formula (1) can be 550 nm. When λ is equal to 550 nm and k=1, the display substrate can reduce to the reflectance of light with a wavelength of 450 nm to 600 nm 10% or less, thereby greatly reducing the reflection of the display substrate on the ambient light.

Since copper has good conductivity, the metal layer 3 can be made of copper. Of course, the material of the metal layer 3 is not limited to copper, and other metals having good conductivity can also be used. The anti-reflection layer 2 may be made of molybdenum oxide. Of course, the material of the anti-reflection layer 2 is not limited to molybdenum oxide, and other conductive materials having a certain light transmittance may also be used.

Since the etching rate of molybdenum oxide in the acidic etching solution is greater than that of copper in the acidic etching solution, in order to avoid the undercut phenomenon, the composition of the anti-reflection layer 2 needs to be adjusted, and then the etching rate of anti-reflection layer 2 in acidic etching solution is adjusted. In this embodiment, an corrosion-resistant metal is doped in the anti-reflection layer 2, in which the corrosion-resistant metal is a metal having strong resistance to oxidation of oxygen and other corrosion, and will react with usual acid. Specifically, the corrosion-resistant metal may be selected from at least one of: ruthenium, rhodium, palladium, silver, osmium, iridium, platinum, gold and tantalum. The etching rate of the anti-reflection layer 2 in the acidic etching solution can be reduced by doping the anti-reflection layer 2 with corrosion-resistant metal, and the etching rate of the anti-reflection layer 2 in the acidic etching solution can be adjusted by adjusting the content of the corrosion-resistant metal in anti-reflection layer 2, so that the etching rate of the anti-reflection pattern 2 in the acidic etching solution is close to or the same as the etching rate of the metal layer 3 in the acidic etching solution, thereby avoiding the undercut phenomenon.

In a specific embodiment, when the metal layer 3 is made of copper and the anti-reflection layer 2 is made of molybdenum oxide doped with a corrosion-resistant metal, the forming the anti-reflection layer and the metal layer in sequence on the base substrate includes: bombarding a target made of molybdenum oxide doped with a corrosion-resistant metal by using a first plasma, to form the anti-reflection layer on the base substrate; and bombarding a target made of copper by using a second plasma, to form the metal layer on the base substrate.

The first plasma and the second plasma may be the same or different.

Specifically, molybdenum oxide powder and corrosion-resistant metal powder can be sintered to prepare the target made of molybdenum oxide doped with corrosion-resistant metal.

Specifically, in a molybdenum oxide target material doped with a corrosion-resistant metal, the molar ratio of the corrosion-resistant metal to molybdenum is (4:100) to (6:100), so that the etching rate of the anti-reflection layer 2 in the acidic etching solution is close to the etching rate of the metal layer 3 in the acidic etching solution.

In a specific embodiment, during the formation of the anti-reflection layer 2, the gas flow rate of the sputtering gas for forming the first plasma may be in a range of 600 sccm to 800 sccm (standard milliliters per minute), the gas pressure for depositing may be in a range of 0.25 Pa to 0.35 Pa, and the sputtering power can be in a range of 7.5 kw to 8.5 kw. The film-forming rate of the anti-reflection layer 2 may be in a range of 1.3 nm/s to 1.4 nm/s.

In addition to adjusting the composition of the anti-reflection layer 2, the etching rate of the anti-reflection layer 2 in the etching solution can also be adjusted by adjusting the composition of the etching solution. In a specific embodiment, the etching solution may be a mixed solution of $H_2SO_4$ and $H_2O_2$, in which the volume ratio of $H_2O_2$ in the mixed solution may be in a range of 3% to 5%, and the ratio is beneficial to the etching rate of the anti-reflection layer 2 in the acidic etching solution close to the etching rate of metal layer 3 in the acidic etching solution.

In addition, before the metal layer 3 and the anti-reflection layer 2 are etched by the etching solution, the metal ion concentration in the etching solution can also be increased, thereby reducing the etching rate of the metal layer 3 and the anti-reflection layer 2 in the etching solution. If the etching rate is too fast, it is difficult to avoid uneven etching. After reducing the etching rate of the metal layer 3 and the anti-reflection layer 2 in the etching solution, it can improve the uniformity of the size of the formed metal pattern 7 and the anti-reflection pattern 2, which is conducive to improving the product yield of display substrates and enhancing the market competitiveness of products. Therefore, the etching solution for etching the metal layer and the anti-reflection layer includes metal ions, in which the metal ion and the metal layer share the same metal element.

When the metal pattern 7 is a signal line, the second slope angle of the metal pattern 7 is (A−5°) to (A+5°), and a line width of the signal line is (D−1) μm to (D+1) μm, in which A is a preset reference value of the second slope angle, D is a preset reference value of the width of the signal line, a line width of the metal pattern 7 is a width of an orthogonal projection of the metal pattern 7 on the base substrate in a third direction, and the third direction is perpendicular to the extending direction of the metal pattern. In this way, it can ensure the size uniformity of the metal pattern 7, and optimize the signal transmission performance of the display substrate. The signal line of the display substrate includes, but is not limited to, a gate line, a data line, and a common electrode line.

Specifically, the second slope angle and line width of the metal pattern 7 at different positions may be equal, that is, the sizes of the metal pattern 7 at different positions are the same.

Specifically, when the metal layer 3 is made of copper, the concentration of copper ions in the etching solution may be in a range of 200 ppm to 1500 ppm, thereby effectively reducing the etching rate of the metal layer 3 and the anti-reflection layer 2 in the etching solution, so as to ensure the uniformity of the size of the metal pattern 7 and the anti-reflection pattern 2.

When other metal materials are used for the metal layer 3, the concentration of metal ions in the etching solution can also be adjusted to reduce the etching rate of the metal layer 3 and the anti-reflection layer 2 in the etching solution. For example, when the metal layer is made of aluminum, the concentration of aluminum ions in the etching solution can be increased, and so on.

After the corrosion-resistant metal is doped into the anti-reflection pattern 6, the contact resistance between the anti-reflection pattern 6 and the metal pattern 7 can also be reduced. When the metal pattern 7 is a signal line, the signal transmission condition on the signal line can be optimized.

When the metal pattern 7 is a gate metal pattern, in this embodiment, since the distance between the first edge and the second edge is reduced, after the gate insulating layer is formed on the gate metal pattern, the parasitic capacitance between the metal pattern 7 and the data line of the display substrate can also be reduced, thereby preventing the electrical signal on the metal pattern 7 from affecting the data voltage on the data line, and further avoiding flickering of the picture and improving the display effect of the display device.

In a specific example, the method for preparing the display substrate includes the following steps.

Step 1: as shown in FIG. 4, forming an anti-reflection layer 2 on the base substrate 1.

A physical vapor deposition (PVD) device can be used to deposit a layer of molybdenum oxide film doped with tantalum as the anti-reflection layer. Specifically, in a vacuum environment, under the combined action of voltage and magnetic field, the molybdenum oxide target is bombarded with ionized inert gas ions such as Ar particles, so that the molybdenum oxide target is ejected in the form of ions, atoms or molecules and deposited on the base substrate to form a molybdenum oxide film. In the molybdenum oxide target, the molar ratio of tantalum to molybdenum is (4:100)

to (6:100), the flow rate of Ar gas is controlled to 700 sccm, the deposition pressure is adjusted to 0.3 Pa, the deposition power is 8 kw, the deposition rate is controlled to 1.35 nm/s, to ensure that the deposited film is uniform, and the anti-reflection layer 2 with a thickness of about 54 nm is formed.

Step 2: as shown in FIG. 4, depositing a metal layer 3 on the anti-reflection layer 2.

Specifically, a layer of copper can be deposited as a metal layer 3 using PVD equipment.

Step 3: coating photoresist on the metal layer 3, and exposing and developing the photoresist using a mask plate, as shown in FIG. 5, to form a photoresist pattern 8;

Step 4: etching the metal layer 3 and the anti-reflection layer 2 by a mixed solution of $H_2SO_4$ and $H_2O_2$ with the photoresist pattern 8 as a mask, as shown in FIG. 3A, to obtain a metal pattern 7 and an anti-reflection pattern 6.

In the mixed solution of $H_2SO_4$ and $H_2O_2$, the volume ratio of $H_2O_2$ accounts for 4%, and the concentration of Cu ion is in a range of 200 ppm to 1500 ppm.

Specifically, the copper block can be etched by a mixed solution of $H_2SO_4$ and $H_2O_2$ to increase the concentration of Cu ions in the mixed solution of $H_2SO_4$ and $H_2O_2$. After increasing the concentration of Cu ions in the mixed solution of $H_2SO_4$ and $H_2O_2$, the etch rate of the mixed solution of $H_2SO_4$ and $H_2O_2$ to the metal layer 3 and the anti-reflection layer 2 can be reduced, thereby further improve the uniformity of the size of the metal pattern 7 and the anti-reflection pattern 6.

At the same time, the anti-reflection layer 2 uses tantalum-doped molybdenum oxide, and thus the etching rate of the anti-reflection layer 2 in the mixed solution is reduced. In this way, it will reduce the difference in the etching rate from copper, thereby avoiding the occurrence of the undercut phenomenon.

Step 5: stripping a remaining photoresist.

After the above steps, the production of the metal pattern 7 and the anti-reflection pattern 6 can be completed. The metal pattern 7 may be the gate metal layer pattern of the display substrate. When the anti-reflection pattern 6 is made of molybdenum oxide doped with tantalum, the anti-reflection pattern 6 also has a certain conductivity, and is parallel to the gate metal layer pattern to improve the conductive property of the gate metal layer pattern, and further improve the product yield of the display substrate.

Of course, the metal pattern 7 is not limited to the gate metal layer pattern of the display substrate, but may also be the source-drain metal layer pattern of the display substrate. When the metal pattern 7 is the source-drain metal layer pattern of the display substrate, the provision of the anti-reflection pattern 6 on a surface of the metal pattern 7 facing the base substrate 1 also helps to reduce the reflectivity of the display substrate, and the anti-reflection pattern 6 connected in parallel with the metal pattern 7 is capable of improving the conductivity of the source-drain metal layer pattern and further improve the product yield of the display substrate rate.

After the production of the metal pattern 7 and the anti-reflection pattern 6 is completed by the above steps, the other film layer of the display substrate, such as the gate insulating layer, the active layer, the anode, the cathode, etc., can be continued to be prepared, so as to complete the production of the display substrate.

In the method embodiments of the present disclosure, the serial numbers of the steps cannot be used to define the sequence of the steps. As for one skilled in the art, the changes in the order of steps without paying creative work also fall within the scope of the present disclosure.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The above descriptions are preferred embodiments of the present disclosure. It should be noted that one skilled in the art would make several improvements and substitutions without departing from the principles of the present disclosure. These improvements and modifications should also be regarded as the protection scope of the present disclosure.

The invention claimed is:

1. A display substrate, comprising:
a base substrate;
a metal pattern located on the base substrate; and
an anti-reflection pattern located on a surface of the metal pattern proximate to the base substrate,
wherein a difference between a first slope angle of the anti-reflection pattern and a second slope angle of the metal pattern is less than a first threshold, and a distance between a first edge of a side surface of the anti-reflection pattern proximate to the metal pattern and a second edge of a side surface of the metal pattern proximate to the anti-reflection pattern is less than a second threshold;
the first slope angle is an acute angle formed between the side surface of the anti-reflection pattern and the base substrate, the second slope angle is an acute angle formed between the side surface of the metal pattern and the base substrate, and the first edge and the second edge are located on a same side of the anti-reflection pattern;
wherein the metal pattern is a gate metal layer pattern of the display substrate, a material of the metal pattern is copper, and a material of the anti-reflection pattern is molybdenum oxide doped with a corrosion-resistant metal;
wherein the corrosion-resistant metal is selected from precious metals, VB group elements, and platinum group elements.

2. The display substrate of claim 1, wherein the first threshold is 5°, and the second threshold is 10 nm.

3. The display substrate of claim 2, wherein the first slope angle is equal to the second slope angle, and the first edge coincides with the second edge.

4. The display substrate of claim 1, wherein the first slope angle is in a range of 55° to 65°, and the second slope angle is in a range of 55° to 65°.

5. The display substrate of claim 1, wherein the metal pattern comprises a signal line, a second slope angle of the signal line is (A−5°) to (A+5°), and a line width of the signal line is (D−1)μm to (D+1)μm, wherein A is a reference value of the second slope angle and D is a reference value of the width of the signal line.

6. The display substrate of claim 1, wherein a thickness of the anti-reflection pattern satisfies:

$$2*n*h=(2k-1)*(\lambda/2),$$

wherein n is a refractive index of the anti-reflection pattern, h is the thickness of the anti-reflection pattern, k is a positive integer, and λ is a wavelength of incident light.

7. The display substrate of claim 6, wherein n is in a range of 2.2 to 2.3, and the thickness of the anti-reflection pattern is in a range of 50 nm to 60 nm.

8. The display substrate of claim 1, wherein the corrosion-resistant metal comprises at least one of: ruthenium, rhodium, palladium, silver, osmium, iridium, platinum, gold, and tantalum.

9. The display substrate of claim 1, wherein in the anti-reflection pattern, a molar ratio of the corrosion-resistant metal to molybdenum is (4:100) to (6:100).

10. A display device, comprising the display substrate according to claim 1 and a color filter substrate arranged oppositely to form a cell with the display substrate, wherein the display substrate is located on a light exiting side of the color filter substrate.

11. A method for preparing a display substrate, comprising:
providing a base substrate;
forming an anti-reflection layer and a metal layer in sequence on the base substrate;
coating a photoresist on the metal layer, and exposing and developing the photoresist to form a photoresist pattern;
forming an anti-reflection layer pattern and a metal pattern respectively by simultaneously etching the anti-reflection layer and the metal layer with an etching solution using the photoresist pattern as a mask, wherein a difference between a first slope angle of the anti-reflection pattern and a second slope angle of the metal pattern is less than a first threshold, and a distance between a first edge of a side surface of the anti-reflection pattern proximate to the metal pattern and a second edge of a side surface of the metal pattern proximate to the anti-reflection pattern is less than a second threshold, and wherein the first slope angle is an acute angle formed between a side surface of the anti-reflection pattern and the base substrate, the second slope angle is an acute angle formed between a side surface of the metal pattern and the base substrate, and the first edge and the second edge are located on a same side of the anti-reflection pattern;
wherein the forming the anti-reflection layer and the metal layer in sequence on the base substrate comprises:
bombarding a target made of molybdenum oxide doped with a corrosion-resistant metal by using a first plasma, to form the anti-reflection layer on the base substrate; and
bombarding a target made of copper by using a second plasma, to form the metal layer on the base substrate.

12. The method of claim 11, wherein a difference between an etching rate of the anti-reflection layer and an etching rate of the metal layer in a same etching conditions is less than a rate threshold.

13. The method of claim 12, wherein the rate threshold is 0.5 nm/s.

14. The method of claim 11, wherein in the target made of molybdenum oxide doped with the corrosion-resistant metal, a molar ratio of the corrosion-resistant metal to molybdenum is (4:100) to (6:100).

15. The method of claim 11, wherein a film-forming rate of the anti-reflection layer is in a range of 1.3 nm/s to 1.4 nm/s.

16. The method of claim 11, wherein the etching solution is a mixed solution of $H_2SO_4$ and $H_2O_2$, and a volume ratio of $H_2O_2$ in the mixed solution is in a range of 3% to 5%.

17. The method of claim 11, wherein the etching solution includes a metal ion, and the metal ion and the metal layer are made of a same metal element.

* * * * *